(12) United States Patent (10) Patent No.: US 8,581,585 B2
Arai (45) Date of Patent: Nov. 12, 2013

(54) MAGNETIC RESONANCE IMAGING APPARATUS, INITIAL STATE CREATION METHOD, OPTIMUM INTENSITY DETERMINATION METHOD, AND MAGNETIC RESONANCE IMAGING METHOD

(75) Inventor: Koichi Arai, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 481 days.

(21) Appl. No.: 12/864,789

(22) PCT Filed: Feb. 2, 2009

(86) PCT No.: PCT/JP2009/051704
§ 371 (c)(1),
(2), (4) Date: May 19, 2011

(87) PCT Pub. No.: WO2009/101871
PCT Pub. Date: Aug. 20, 2009

(65) Prior Publication Data
US 2011/0213235 A1 Sep. 1, 2011

(30) Foreign Application Priority Data
Feb. 12, 2008 (JP) .................................. 2008-030712

(51) Int. Cl.
*G01V 3/00* (2006.01)
(52) U.S. Cl.
USPC .......................................... 324/318; 324/309
(58) Field of Classification Search
USPC .......................... 324/300–322; 600/407–445
See application file for complete search history.

(56) References Cited

U.S. PATENT DOCUMENTS

| 5,684,398 | A | * | 11/1997 | Takiguchi et al. | 324/306 |
| 6,466,015 | B2 | * | 10/2002 | Schaeffter et al. | 324/309 |
| 6,477,398 | B1 | * | 11/2002 | Mills | 600/409 |
| 7,382,129 | B2 | * | 6/2008 | Mills | 324/318 |
| 7,573,266 | B2 | * | 8/2009 | Feiweier et al. | 324/307 |
| 8,299,789 | B2 | * | 10/2012 | Heid et al. | 324/309 |
| 2007/0078333 | A1 | | 4/2007 | Abe et al. | |

FOREIGN PATENT DOCUMENTS

| JP | 1-141653 | 6/1989 |
| WO | WO2004/044603 | 5/2004 |
| WO | WO2005/034749 | 4/2005 |

OTHER PUBLICATIONS

Carr, H.Y. (1958), "Steady-State Free Precession in Nuclear Magnetic Resonance", Physical Review, vol. 112, No. 5, pp. 1693-1701.
Bernstein, Matt A. (2004), Hanbook of MRI Pulse Sequences, pp. 582-596.
Japanese official action dated Nov. 19, 2012 in connection with a corresponding Japanese patent application.

* cited by examiner

*Primary Examiner* — Brij Shrivastav
(74) *Attorney, Agent, or Firm* — Cooper & Dunham LLP

(57) ABSTRACT

This aims to shorten the time period, which is required for optimizing a radio-frequency magnetic field pulse intensity, thereby to shorten the measurement time period of an MRI entirety.
In the operation for optimizing the radio-frequency magnetic field pulse intensity, an initial state for applying radio-frequency magnetic field pulses is intentionally created for a short time period, thereby to shorten the radio-frequency magnetic field pulse interval for the repeated applications.
The radio-frequency magnetic field pulses are repeatedly applied at a predetermined time interval sufficiently shorter than the relaxing time period of the radio-frequency magnetic field pulses, and the state in which the magnetic resonance signal intensity becomes a threshold value or less is set to an initial state.

14 Claims, 17 Drawing Sheets

MAGNETIC RESONANCE IMAGING APPARATUS, INITIAL STATE CREATION METHOD, OPTIMUM INTENSITY DETERMINATION METHOD, AND MAGNETIC RESONANCE IMAGING METHOD

FIELD OF THE INVENTION

The present invention relates to a magnetic resonance imaging (hereinafter referred to as "MRI") apparatus that measures a nuclear magnetic resonance (hereinafter referred to as "NMR") signal from hydrogen, phosphorus, etc. in an object to be examined and reconstructs images of density distribution or relaxation time distribution, etc. of nucleus, in particular to a technique that adjusts intensity of the high-frequency magnetic field to be applied.

DESCRIPTION OF RELATED ART

An MRI apparatus measures an object, particularly NMR signals produced from atomic nuclei spin which forms tissues of a human body, and reconstructs images of shape or function of the head region, abdominal region or four limbs, etc. 2-dimensionally or 3-dimensionally. In the MRI apparatus, the NMR signals that are phase encoded or frequency-encoded by a gradient magnetic field are measured as time-series data. The measured NMR signals are reconstructed as images by being 2-dimensionally or 3-dimensionally Fourier transformed.

Atomic nuclei spin (hereinafter referred to as "spin") in the object facing toward the static magnetic field direction in a static magnetic field is tilted by receiving application of a high-frequency magnetic field. Here, the high-frequency magnetic field to be applied at certain amplitude and in a certain period of time is referred to as an RF pulse, and the angle wherein the atomic nuclei spin is tilted is referred to as flip angle. In the following description, application time and amplitude of an RF pulse will be combined and referred to as intensity. Therefore, the flip angle will be defined in accordance with intensity of the RF pulse. In general, the RF pulse to be applied with the intensity wherein the flip angle is θ is referred to as θ pulse. For example, the RF pulse wherein the flip angle is 90° will be referred to as 90° pulse.

In MRI, the state of the reception coil system which receives NMR signals varies in accordance with the difference of attributes associated with shape of the object, biological tissues, etc. For this reason, there are cases that the flip angles of the spin differ depending on the region of the object even when the same intensity of RF pulse is applied, which interferes with precise measurement. In order to prevent such a problem, a technique is known that optimizes intensity of RF pulse for each attribute using the NMR signal itself for measurement (hereinafter referred to as "echo signal") so as to acquire the same flip angle even when the attributes of the object are different (for example, refer to Patent Document 1). RF pulse intensity is optimized prior to imaging each time that the attribute changes, and imaging is executed using the RF pulse having the optimized intensity.

Patent Document 1: JP-A-S61-191949

In the technique disclosed in Patent Document 1, optimization of the RF pulse intensity is executed, by repeating applications while performing fine-adjustment of intensity of the RF pulse and making the intensity at the time that the echo signal intensity reaches the maximum as the optimized intensity of the application RF pulse. At this time, application of the RF pulse is repeated by waiting for the tilted spin to return to the thermal equilibrium state. Therefore, the time required for optimization of RF pulse intensity is dependent on the time that it takes for the spin tilted by the RF pulse to return to the thermal equilibrium state (hereinafter referred to as "relaxation time"). Since the higher the magnetic field is the longer the relaxation time becomes, in the case of using the technique disclosed in Patent Document 1, the time required for optimization of RF pulse becomes longer. As a result, in the case that MRI is to be executed after optimizing the RF pulse using the technique disclosed in Patent Document 1, the entire measurement time increases.

The objective of the present invention is to shortens measurement time of an entire MRI by reducing the time required for optimization of RF pulse intensity, considering the above-described problems.

BRIEF SUMMARY OF THE INVENTION

The present invention, in the process to optimize RF pulse intensity, purposely creates the initial state for applying the RF pulse to reduce the intervals between the RF pulses to be applied repeatedly. Also, the state that intensity of the magnetic resonance signal reaches the value lower than a predetermined value is set as the initial state, by repeatedly applying a radio-frequency magnetic field pulse at a predetermined interval which is sufficiently shorter than the relaxation time of the radio-frequency magnetic field pulse.

In concrete terms, the magnetic resonance imaging apparatus of the present invention comprises:

gradient magnetic field application unit configured to apply a gradient magnetic field to an object to be examined placed in a static magnetic field;

a radio-frequency magnetic field pulse application unit configured to apply a radio-frequency magnetic field pulse for exciting the magnetization of the object at a predetermined flip angle;

a measurement unit configured to measure the magnetic resonance signals produced from the object; and control unit configured to control operation of the gradient magnetic field application unit, radio-frequency magnetic field pulse application unit, and measurement unit, characterized in that the control unit comprises a quasi-stationary state generation unit configured to control operation of the gradient magnetic field application unit and radio-frequency magnetic field pulse application unit, after the radio-frequency magnetic field pulse application unit applies the radio-frequency magnetic field pulse, so as to generate the quasi-stationary state wherein the magnetic resonance signal has the value less than a predetermined threshold value within a predetermined time.

In accordance with the present invention, it is possible to reduce measurement time of the entire MRI by reducing the time required for optimization of RF pulse intensity.

DETAILED DESCRIPTION OF THE INVENTION

First Embodiment

The first embodiment to which the present invention is applied will be described below referring to the diagrams. In the entire diagrams, the same function parts are represented by the same reference numerals, and the duplicative description thereof is omitted.

First, the overall overview of an example of the MRI apparatus related to the present embodiment will be described. FIG. 1 is a block diagram showing the general configuration of the MRI apparatus related to the present embodiment. MRI apparatus 100 is for obtaining a tomographic image of an object to be examined using NMR phenomenon, and comprises static magnetic field generation system 2, gradient magnetic field generation system 3, transmission system 5, reception system 6, signal processing system 7, sequencer 4 and central processing unit (CPU) 8.

Static magnetic field generation system 2 is for generating a uniform static magnetic field in the space around object 1 in the direction orthogonal to the body axis if using the vertical magnetic field method and in the body-axis direction if using the horizontal magnetic field method, and a static magnetic field source using the permanent magnet method, normal conduction method or superconduction method is disposed around the object 1.

Gradient magnetic field generation system 3 comprises gradient magnetic field coil 9 wound in 3-axes directions of X, Y and Z in the coordinate system (coordinate system at rest) of MRI apparatus 100 and gradient magnetic field source 10 that drives the respective gradient magnetic field coils, and applies gradient magnetic fields Gx, Gy and Gz to object 1 in 3-axes directions of X, Y and Z by driving gradient magnetic field source 10 of the respective coils according to the command from sequencer 4 to be hereinafter described. Generally, gradient magnetic field generation system 3 applies slice direction gradient magnetic field pulse (Gs) in any one direction of X, Y and Z to set the slice plane (imaging plane) with respect to object 1 and applies phase encode direction gradient magnetic field pulse (Gp) and frequency encode direction gradient magnetic field pulse (Gf) in the remaining two directions, so as to encode positional information of the respective directions to the echo signal.

Transmission system 5 is for applying a radio-frequency magnetic field pulse (hereinafter referred to as RF pulse) to cause nuclei atomic spin of atomic elements which constitute biological tissues of object 1 to generate nuclear magnetic resonance, and comprises high-frequency oscillator 11, modulator 12, high-frequency amplifier 13 and high-frequency coil (transmission coil) 14a of the transmission side. The radio-frequency pulse outputted from high-frequency oscillator 11 is amplitude-modulated by modulator 12 at the timing commanded from sequencer 4, and the amplitude-modulated radio-frequency pulse is amplified in high-frequency amplifier 13 and provided to transmission coil 14a which is placed in the vicinity of object 1, so that the electromagnetic wave (RF pulse) is applied to object 1.

Reception system 6 is for detecting an NMR signal (echo signal) emitted by nuclear magnetic resonance of atomic nuclei spin which constitute biological tissues of object 1, and comprises high-frequency coil (reception coil) 14b on the reception side, signal amplifier 15, quadrature detector 16 and A/D converter 17. The electromagnetic wave (NMR signal) which is induced by the electromagnetic wave applied from transmission coil 14a and is a response of object 1 is detected by reception coil 14b placed in the vicinity of object 1. The detected NMR signal is amplified by signal amplifier 15, divided into two-channels of signals that are orthogonal to each other by quadrature detector 16 at a timing commanded from sequencer 4, converted into digital amount by A/D converter 17 respectively, and transmitted to signal processing system 7.

Sequencer 4 controls the RF pulse and the gradient magnetic field pulse so as to be applied according to a predetermined pulse sequence. It is operated under control of CPU 8, and transmits various commands necessary for collecting data of a tomographic image of object 1 to transmission system 5, gradient magnetic field generation system 3 and reception system 6. The pulse sequence is a time chart formed by the pair of the RF pulse, on/off timing of the gradient magnetic field pulse, etc., amplitude and so on, created in advance according to the objective of imaging, and stored in a device such as a memory (not shown in the diagram) as program. CPU 8 controls sequencer 4 according to the pulse sequence.

Signal processing system 7 is for executing display and storage of various data processes and the results thereof, and is configured by CPU 8, storage device 18 such as Rom or Ram, external storage device 19 such as an optical disk or magnetic disk and display 20 configured by CRT, etc. When data from reception system 6 is inputted to CPU 8, CPU 8 executes processing such as signal processing and image reconstruction, displays the tomographic image of object 1 which is the result of the executed process on display 20 and stores it in external storage device 19.

Operation unit 25 is for receiving input of various control information of MRI apparatus 100 itself and various control information of the processing to be executed in signal processing system 7, and comprises trackball or mouse 23 and keyboard 24. Operation unit 25 is placed in the vicinity of display 20, and an operator interactively inputs information necessary for various processes of MRI apparatus 100 via operation unit 25 while observing display 20.

In FIG. 1, transmission coil 14a and gradient magnetic field coil 9 are disposed in the static magnetic field space of static magnetic field generation system 2 in which object 1 is placed facing object 1 if the vertical magnetic field method is used and surrounding object 1 if the horizontal magnetic field method is used. Also, reception coil 14b is placed facing object 1, or so as to surround object 1.

Currently the imaging target nuclear species of MRI apparatuses which is widely used in clinical practice is hydrogen nucleus (proton) which is a main constituent of the object. In MRI apparatuses, shape or function of the head region, abdominal region or four limbs of a human body are imaged two-dimensionally or 3-dimensionally by reconstructing an image from the information regarding spatial distribution of proton density or spatial distribution of the relaxation time of the excitation state.

In the present embodiment, the RF pulse (reference pulse) having the optimum intensity is determined prior to imaging. That is, by repeating application of the RF pulse while changing and fine-adjusting the intensity, the RF pulse having the intensity where the peak value or integrated intensity of the echo signal reaches the maximum value is determined as the reference pulse. In this embodiment, however, quasi-stationary state which is the state that the echo signal is hardly generated within the time that is shorter than the relaxation time is created, and application of the RF pulse is repeated by setting the quasi-stationary state as the initial state. The case of using the peak value of the echo signal for determination of the reference pulse will be exemplified in the present embodiment below.

In order to determine the reference pulse by repeating application of the RF pulse without waiting for the relaxation time, MRI apparatus 100 of the present embodiment comprises a reference RF pulse determination unit and a quasi-stationary state generation unit. These devices are functioned when CPU 8 executes the program stored in advance in a device such as memory (not shown in the diagram).

The reference RF pulse determination unit executes the reference pulse determination process for determining the RF pulse having the intensity where the peak value of the echo signal reaches its maximum value. In this reference pulse determination process, the reference pulse determination unit executes the pulse sequence upon receiving the notification from the quasi-stationary generation unit that the quasi-stationary state is generated, and causes the acquired peak value of the echo signal correspond to the intensity of the applied RF pulse and stores it. The intensity of the RF pulse to be applied at the first time is determined in advance by manual operation of the operator. Also, the pulse sequence to be executed is determined in advance. In the following description, the RF pulse to be applied in the sequence which is determined in advance in the reference RF pulse determination process such as the spin echo method (SE) or gradient echo method (GE) will be referred to as the reference determination RF pulse.

Then the reference RF pulse determination unit, upon each generation of the quasi-stationary state, executes the pulse sequence by varying the intensity of the reference determining RF pulse, and repeats causing the acquired peak value of the echo signal correspond to the intensity of the reference determination RF pulse and storing it for a predetermined number of times. After that, using the acquired results, it calculates the intensity corresponding to the maximum peak value and determines it as the intensity of the RF pulse to be used in the subsequent imaging. That is, the RF pulse having the relevant intensity is to be set as the reference RF pulse. The intensity corresponding to the maximum peak value is calculated in the procedure of acquiring the maximum peak value by interpolating the respective peak values obtained by measurement and acquiring the intensity which corresponds to the acquired maximum peak value by interpolation of the stored intensity.

Quasi-stationary state generation unit generates the quasi-stationary state where the echo signal is hardly generated, and executes the quasi-stationary state generation process which notifies the generation of quasi-stationary state to the reference RF pulse determination unit. The quasi-stationary state generation unit in the present embodiment applies the RF pulses at $\alpha$-degrees which is a predetermined flip angle in predetermined time intervals that are set sufficiently shorter than the relaxation time, and repeats measurement of the echo signal. The state wherein the echo signal intensity is lower than a predetermined threshold value is set as the quasi-stationary state. In the following description, the RF pulse to be applied for generation of the quasi-stationary state is referred to as the quasi-stationary state generating RF pulse.

FIG. 2 is for explaining the outline of the quasi-stationary state generation process in the present embodiment. When the direction of a static magnetic field is set as the Z-axis direction, nuclear magnetization vector (hereinafter referred to as "nuclear magnetization") 201 of atomic nuclei spin in the thermal equilibrium state is directed toward the Z-axis direction. When the quasi-stationary state generating RF pulse is applied in the previously set $\beta$-direction at $\alpha$-degrees of flip angle, nuclear magnetization 202 after excitation flips by $\alpha$-degrees. After that, when a predetermined time (Interval) is passed, xy-component of nuclear magnetization 203 of atomic nuclei spin is diffused in the xy-plane via dispersion process caused by a hyperfine magnetic field. In this state, when the quasi-stationary state generating RF pulse is further applied at $\alpha$-degrees of flip angle in $\beta$-direction, since the respective nuclear magnetizations which are diffused in the xy-plane flip for $\alpha$-degrees, nuclear magnetization 204 is diffused in the z-direction since the respective nuclear magnetizations that are diffused in the xy-plane flip at $\alpha$-degrees. At this time, the intervals are set sufficiently shorter than the relaxation time.

By alternately repeating the above-mentioned application of the quasi-stationary state generating RF pulse at $\alpha$-degrees of flip angle in $\beta$-direction and dispersion process caused by hyperfine magnetization, the magnetization becomes the state where the echo signal is not generated (or the signal intensity reaches the value less than a predetermined threshold value), i.e. quasi-stationary state 205, since the magnetization in the z-direction (hereinafter referred to as "longitudinal magnetization") and the magnetization in the xy-plane (hereinafter referred to as "transverse magnetization") are both saturated.

Next, procedure for the quasi-stationary state generation process by the quasi-stationary state generation unit will be described. FIG. 3 is a flowchart showing the quasi-stationary state generation process by the quasi-stationary state generation unit of the present embodiment. First, upon receiving the command for generation of the quasi-stationary state, the quasi-stationary state generation unit applies quasi-stationary state generating RF pulse RF $\alpha\beta$ at $\alpha$-degrees of flip angle in $\beta$-direction along with the slice selecting gradient magnetic field (step S301).

After passing of a predetermined time (WT) (step S302), the quasi-stationary state generation unit measures echo signal intensity EC (step S303), and discriminates magnitude relation between the measured intensity and threshold L (step S304). Here, when echo signal intensity EC is greater than predetermined threshold L, after (Interval-WT) time is passed (step S305), the process returns to step S301, and the quasi-stationary state generating RF pulse is applied once again at $\alpha$-degrees of flip angle in $\beta$-direction along with the slice gradient magnetic field.

In step 305, the reason to wait for Interval-WT time is to saturate the transverse magnetization at the local magnetic field during application intervals (Interval) between the quasi-stationary state generating RF pulses.

On the other hand, in S304, when the echo signal intensity is less than the predetermined threshold, after passing of a predetermined time (longitudinal magnetization restoration time TI) (step S306), generation of the quasi-stationary state is notified to the reference RF pulse determination unit (step S307). While the quasi-stationary state is discriminated as the state wherein the echo signal intensity is less than a predetermined threshold value in step S302 of the present embodiment, it may be configured that the state wherein the echo signal intensity is 0 is to be discriminated as the quasi-stationary state. Also, it may be configured that step S306 is to be executed by the reference RF pulse determination unit.

Next, the pulse sequence for actualizing the reference pulse determination process of the present embodiment will be described. FIG. 4 is the pulse sequence for explaining the outline of the reference pulse determination process in the present embodiment. As shown in FIG. 4, when the reference pulse determination process is started, sequence 410 for actualizing the quasi-stationary state generation process is executed. More specifically, the quasi-stationary state generation unit repeats application of quasi-stationary state generating RF pulse 401 at $\alpha$-degrees of flip angle in $\beta$-direction at a predetermined interval until the echo signal reaches the value lower than the predetermined threshold value. At this time, slice gradient magnetic field 402 is to be applied at the same time as applying each quasi-stationary state generating RF pulse 401.

After passing of longitudinal magnetization recovery time TI 405 from the point when the echo signal reaches the value less than a predetermined threshold value, the reference pulse determination unit executes a predetermined sequence 420 such as the SE method or GE method for determining the reference pulse. Then the reference pulse determination unit stores the peak value of the echo signal along with the intensity of the applied reference determining RF pulse.

After execution of sequence 420 for determining the reference pulse, the quasi-stationary state generation unit executes sequence 410 for actualizing the quasi-stationary state generation process. Then after passing of longitudinal recovery time TI 405 from the quasi-stationary state, the reference determination unit fine-adjusts intensity of the reference determining RF pulse, and executes sequence 420. As described above, the optimum intensity is determined by repeating sequence 410 and sequence 420 for a predetermined number of times and recording the pair of the reference determining RF pulse intensity and the peak value of the echo signal acquired from the relevant RF pulse.

Processing procedure for determining the reference pulse will be described. FIG. 5 is flowchart of the reference pulse determination process related to the present embodiment. Here, the case that a pulse is set at 90-degrees using a spin echo sequence will be exemplified. Also, the peak value of the echo signal is to be collected for nn-times to determine the reference pulse.

Upon receiving the command from an operator to start the reference pulse determining process, the reference pulse determination unit first receives the setting of the target flip angle (intensity) from the operator, and sets it as the intensity of the reference determining RF pulse (step S501). The target flip angle is the flip angle of the RF pulse to be used in the imaging. Here, the pulse is set at 90-degrees. After that, counter "n" for counting the number of recording the echo signal is initiated (here, it is set as n=1) (step S502). Then the reference pulse determination unit gives a command to the quasi-stationary state generation unit to start the quasi-stationary state generation process.

Upon receiving the command, the quasi-stationary state generation unit starts the quasi-stationary state generation process (step S503). More specifically, it executes the above-described quasi-stationary state generation process, discriminates the quasi-stationary state, waits for longitudinal recovery time (TI), and notifies that the quasi-stationary state process has been discriminated to the reference RF pulse determination unit.

Upon receiving the notification, the reference RF pulse determination unit executes the spin echo sequence using reference determining pulse RF θn having the set intensity, and measures the echo signal (step S504). Then it records the peak value of the echo signal and intensity of the reference determining RF pulse (step S505). Next, it discriminates whether or not the measurements of the echo signal reached the previously set number. Here, it discriminates whether or not n≥nn (step S506). In the case that n≥nn, the intensity of the RE pulse corresponding to the maximum peak value is calculated, and the calculated value is set as the RF pulse intensity to be used in the imaging (step S507).

On the other hand, in the case that the measurements do not reach the number which was set in step S506 (n<n), intensity of the reference determining RF pulse is fine-adjusted (step S508), counter "n" is incremented by 1 (step S509) and the procedure returns to step S503. Adjustment amount for the reference determining RF pulse intensity to be applied is to be set in advance.

Intensity of other RF pulses can be determined based on the adjusted reference RF pulse. For example, when the reference RF pulse is a 90-degree pulse, intensity of a 180-degrees pulse can be set as double of the reference RF pulse intensity.

As mentioned above, in accordance with the present embodiment, the interval for repeating application of the reference determining RF pulse for setting the reference RF pulse is addition of the time that the quasi-stationary state is generated and longitudinal magnetization recovery time (TI). The time interval that the quasi-stationary state is generated is interval×(application frequency of the quasi-stationary state generating RF pulse "m"−1)+predetermined time (WT). Since "Interval×(m−1)+WT" is set to be a much shorter time compared to the time that the nuclear spin returns to the thermal equilibrium state, it is possible to repeat application of the reference determining RF pulse in a short time. Therefore, the reference RF pulse can be set in a short time, which leads to reduction of the entire measurement time. In the present embodiment, since the application interval of the quasi-stationary state generating RF pulses is short, the interval of the sound generated upon RF pulse application becomes short.

While the case that the peak value of the echo signal is used for determination of the reference pulse is exemplified in the above-described embodiment, integrated intensity of the echo signal may be used instead. In this case, integrated intensity may be recorded in place of the peak value in the reference pulse determination process, so that the intensity corresponding to the maximum integrated intensity is calculated to be set as the intensity of the RF pulse to be used in the present imaging.

Second Embodiment

Next, the second embodiment to which the present invention is applied will be described. In the quasi-stationary generation process of the first embodiment, the quasi-stationary state generating RF pulse is repeatedly applied at the same flip angle in the same direction. However, the application direction of the quasi-stationary state generating RF pulse to be repeatedly applied is varied in the present embodiment. The flip angle stays the same. Configuration of the present embodiment will be described below exemplifying the case that the peak value of the echo signal is used for determining the reference pulse, focusing on the differences from the first embodiment.

In the present embodiment, application direction of the quasi-stationary state generating RF pulse to be repeatedly applied by the quasi-stationary state generation unit is varied as mentioned above. That is, application direction β is not constant as in the first embodiment, and is changed upon application. The outline of the quasi-stationary state generation process to be executed by the quasi-stationary state generation unit in the present embodiment will be described using FIG. 6.

When the direction of a static magnetic field is set as the z-axis direction, magnetization 601 of atomic nuclei spin in the thermal equilibrium state faces toward the z-axis direction. Here, when the quasi-stationary state generation RF pulse is applied at α-degrees of flip angle in the previously set β1-direction, magnetization 602 flips by α-degrees. In FIG. 6, the case that β1 is set as −y direction is exemplified. After passing of a predetermined time (Interval), xy-component of magnetization 603 of atomic nuclei spin is diffused in the xy-plane via dispersion process caused by a hyperfine magnetic field. In that condition, when the quasi-stationary state generating RF pulse is further applied at α-degrees of flip angle in β2-direction, since the respective magnetizations which had been diffused in xy-plane flip by α-degrees, magnetization 604 diffuses in the z-direction. In the present diagram, the case that β2 is set as the z-direction is exemplified. Here, the interval is to be set sufficiently shorter than the relaxation time. Hereinafter, application direction of the quasi-stationary state generating RF pulse at the m-th time is denoted as βm. Also, the quasi-stationary state generating RF pulse at α-degrees of flip angle being applied in βm-direction will be denoted as RFβmα.

By alternately repeating application of reference quasi-stationary generating RF pulse RFβmα and dispersion process caused by the hyperfine magnetic field, both the longitudinal magnetization and the transverse magnetization are saturated, whereby generating the state wherein the echo signal is lower than a predetermined threshold value, i.e. quasi-stationary state 605. The direction to apply the quasi-stationary state generating RF pulse is to be determined in advance. For example, a plurality of application directions and application order in the respective directions are to be set in advance.

Next, procedure of the quasi-stationary state generation process to be executed by the quasi-stationary state generation unit will be described. FIG. 7 is a flowchart of the quasi-stationary generation process by the quasi-stationary state generation unit of the present embodiment. First, upon receiving the command to generate the quasi-stationary state, the quasi-stationary state generation unit initializes counter "m" for counting the number of times the quasi-stationary state generating RF pulse is applied (here, it is set as m=1) (step S701). Next, quasi-stationary state generating RF pulse RFβmα is applied at α-degrees of flip angle in βm-direction along with the slice selecting gradient magnetic field (step S702).

After passing of a predetermined time (WT) (step S703), the quasi-stationary state generation unit measures echo signal intensity (step 704), and discriminates magnitude relation between echo signal intensity EC and threshold value L (step S705). Here, when the echo signal intensity is greater than the predetermined threshold value, after passing of Interval-WT time (step S706), counter "m" is incremented by 1 (step S707), the procedure is returned to step 702, and the quasi-stationary state generating RF pulse is applied in βm-direction at α-degrees of flip angle along with the slice gradient magnetic field.

On the other hand, when the echo signal intensity is smaller than the predetermined threshold value in S705, after passing of predetermined time (longitudinal magnetization recovery time TI) (step 708), generation of the quasi-stationary state is notified to the reference RF pulse determination unit (step S709). In the present embodiment also, the state that echo signal intensity is zero may be discriminated as the quasi-stationary state in step S705.

Next, the pulse sequence of the present embodiment for actualizing the reference pulse determination process will be described. FIG. 8 is a pulse sequence diagram for explaining the outline of the reference pulse determination process related to the present embodiment. As shown in the present diagram, when the reference pulse determination process is started, sequence 810 for actualizing the quasi-stationary state generation process is first executed. Here, the quasi-stationary state generation unit repeats application of quasi-stationary state generating RF pulse 801 at α-degrees of flip angle in βm (m=1, 2, 3 . . . ) direction at predetermined intervals, until the echo signal intensity reaches the value less than the predetermined threshold value. At this time, slice gradient magnetic field 802 is applied at the same time as application of each quasi-stationary state generation RF pulse 801.

After passing of longitudinal magnetization recovery time TI 805 from the point when the echo signal intensity reached the value less than the predetermined threshold value, the reference pulse determination unit executes a predetermined sequence 820 such as SE method or GE method for determining the reference pulse. Then the reference pulse determination unit measures the peak value of the echo signal and stores it along with the intensity of the applied reference determining RF pulse.

After execution of sequence 820 for determining the reference pulse, the quasi-stationary state generation unit executes sequence 810 for actualizing the quasi-stationary state generation process. Then after passing of longitudinal magnetization recovery time TI 805 from the quasi-stationary state, the reference pulse determination unit fine-adjusts the intensity of the reference determining RF pulse and executes sequence 820. In this manner, by repeating execution of sequence 810 and sequence 820 for a predetermined number of times, the pair of the reference determining RF pulse intensity and the peak value of the echo signal acquired by the relative RE pulse is recorded so as to determine the optimum intensity.

Configuration of the MRI apparatus and processing procedure of the reference pulse determination process related to the present embodiment will be omitted here since they are the same as the first embodiment.

As stated above, in accordance with the present embodiment, the interval for repeating application of the reference determining RF pulses in order to set the reference RF pulse is the sum of the time that the quasi-stationary state is generated and the longitudinal magnetization recovery time (TI). The time interval in which the quasi-stationary state is generated is: Interval×(application frequency of the quasi-stationary state generating RF pulse "m"−1)+predetermined time (WT). Interval×(m−1)+WT is set to be a much shorter time compared to the time that nuclear spin returns to the thermal equilibrium state. Also, when the quasi-stationary state is generated in the present embodiment, the direction of the quasi-stationary state generating RF pulse is changed upon application. In this manner, since magnetization can be diffused in any direction, the quasi-stationary state can be generated by a smaller number of application times compared to the first embodiment, whereby improving efficiency in generation of the quasi-stationary state. Therefore, it is possible to further reduce the time for repeating application of the reference determining RF pulse, which leads to reduction of the time for setting the reference RF pulse and also the entire measurement time. In the present embodiment also, interval of the sound to be caused upon application of RF pulse becomes shorter compared to the conventional method, since the application intervals of the quasi-stationary state generating RF pulse is short.

Also, since application frequency of the quasi-stationary state generating RF pulse is reduced, electro-magnetic energy to be absorbed by an object (SAR) can also be reduced.

Third Embodiment

Next, the third embodiment to which the present invention is applied will be described. In the present embodiment, a spoiler gradient magnetic field is applied after the quasi-stationary state generating RF pulse is applied in the quasi-stationary state generation process. By applying the spoiler gradient magnetic field, transverse magnetization is saturated (transverse magnetization is eliminated), and transition to the quasi-stationary state can be expedited. Configuration of the present embodiment will be described below focusing on the difference from the first embodiment. In the present embodiment also, the case of using the peak value of the echo signal will be exemplified for determination of the reference pulse.

As stated above, the spoiler gradient magnetic field is to be applied during application of the quasi-stationary state generating RF pulse in the present embodiment. The outline of the quasi-stationary state generation process to be executed by the quasi-stationary state generation unit will be described referring to FIG. 9.

When the direction of the static magnetic field is set as the z-axis direction, nuclear magnetization 901 of the atomic nuclear spin in the thermal equilibrium state faces toward the z-axis direction. When the quasi-stationary state generating RF pulse is applied here at α-degrees of flip angle in the previously set β-direction, nuclear magnetization 902 after being excited by the present quasi-stationary state generating RF pulse flips by α-degrees. After that, when the spoiler gradient magnetic field is applied at least one of the x, y or z-directions, xy-component of nuclear magnetization 903 of the atomic nuclear spin is diffused in the xy-plane via dispersion process caused by the spoiler gradient magnetic field and the hyperfine magnetic field. In that condition, when the quasi-stationary state generating RF pulse is further applied in β-direction at α-degrees of flip angle, since the respective nuclear magnetizations being diffused in the xy-plane flip by α-degrees, nuclear magnetization 904 is diffused in the z-direction. Here, the spoiler gradient magnetic field application time (GCInterval) is sufficiently shorter than the relaxation time. In this manner, in the present embodiment, the transverse magnetization is saturated by applying the spoiler gradient magnetic field.

By alternately repeating application of quasi-stationary state generating RF pulse RF in β-direction at α-degrees of flip angle and application of the spoiler gradient magnetic field with dispersion process caused by the hyperfine magnetic field, both the longitudinal magnetization and the transverse magnetization are saturated and the condition that the echo signal has the value lower than a predetermined threshold value, i.e. quasi-stationary state 905 is generated.

Next, quasi-stationary state generation process executed by the quasi-stationary state generation unit of the present embodiment will be described. FIG. 10 is a flowchart of the quasi-stationary state generation procedure to be executed by the quasi-stationary state generation unit of the present embodiment. First, upon receiving the command to generate the quasi-stationary state, the quasi-stationary state generation unit applies quasi-stationary state generating RF pulse βα in β-direction at α-degrees of flip angle along with the slice selecting gradient magnetic field (step S1001).

After passing of predetermined time (WT) (step S1002), the quasi-stationary state generation unit measures echo signal intensity EC (step S1003), and discriminates magnitude relation between the measured intensity and threshold value L (step S1004). When the echo signal intensity is greater than the predetermined threshold value, a spoiler gradient magnetic field is applied (step S1005). Then the process returns to step S1001, and quasi-stationary state generating RF pulse βα is applied again in β-direction at α-degrees of flip angle along with the slice gradient magnetic field.

On the other hand, when the echo signal intensity is less than the threshold value in step S1004, after passing of a predetermined time (longitudinal magnetization recovery time TI) (step S1006), generation of the quasi-stationary state is notified to the reference RF pulse determination unit (step S1007).

Next, the pulse sequence for actualizing the reference pulse determination process related to the present embodiment will be described. FIG. 11 is a pulse sequence diagram for explaining the outline of the reference pulse determination process related to the present embodiment. As shown in the present diagram, when the reference determination process is started, sequence 1110 for actualizing the quasi-stationary state generation process is executed. More specifically, the quasi-stationary state generation unit alternately repeats application of quasi-stationary state generating RF pulse 1101 in β-direction at α-degrees of flip angle and application of spoiler gradient magnetic fields 1109, 1110 and 1111 in at least one direction of x, y and z-directions until the echo signal reaches the value lower than a predetermined threshold value. Meantime, slice gradient magnetic field 1102 is applied at the same time as applying quasi-stationary state generating RF pulse 1101.

After passing of longitudinal magnetization recovery time TI 1105 from the time when the echo signal reached the value lower than the predetermined threshold value, the reference pulse determination unit executes a predetermined sequence 1120 such as the SE method or GE method for determining the reference pulse. After the execution, the sequence is stored along with the reference pulse intensity.

By repeating the above-described sequence 1110 and sequence 1120 for a predetermined number of times and recording the pair of the reference determining RF pulse intensity and the peak value of the echo signal acquired by the relevant RF pulse, the optimum intensity is determined.

Configuration of the MRI apparatus and the procedure for the reference pulse determination process to be executed by the reference pulse determination unit related to the present embodiment will be omitted here since they are the same as the first embodiment.

As stated above, in accordance with the present embodiment, the interval between repeating applications of the reference determining RF pulse for setting the reference RF pulse is the sum of the time for generating the quasi-stationary state and the longitudinal magnetization recovery time. The time interval for generating the quasi-stationary state is: (GCInterval+WT)×(application frequency of the quasi-stationary state generating RF pulse "m"−1)+WT. (GCInterval+WT)×(m−1)+WT is much shorter compared to the time that the nuclear spin returns to the thermal equilibrium state. In particular, unlike the first and the second embodiments, the spoiler gradient magnetic field is applied in the present embodiment after application of the quasi-stationary state generating RF pulse in place of waiting for the interval time. By doing so, the traverse magnetization can be eliminated even more speedily, which enables more effective generation of the quasi-stationary state. Therefore, compared to the first embodiment, the time for repeating applications of the reference determining RF pulse can be further shortened, whereby making it possible to reduce the time for setting the reference RF pulse and also the entire measurement time. In the present embodiment also, intervals between the sounds to be caused by application of RF pulses become shorter since the intervals between applications of the quasi-stationary state generating RF pulse are shorter.

Also, since application frequency of the quasi-stationary state generating RF pulse is reduced, electro-magnetic energy to be absorbed by the object (SAR) can also be reduced.

Fourth Embodiment

Next, the fourth embodiment to which the present invention is applied will be described. In the present embodiment, in the quasi-stationary state generation process, the direction to apply the quasi-stationary state generating RF pulse to be repeatedly applied is varied in the same manner as the second embodiment. Further, after applying the quasi-stationary state generating RF pulse, the spoiler gradient magnetic field is applied in at least one direction of the x, y and z-directions, in the same manner as the third embodiment. The present embodiment will be described below focusing on the difference from the above-mentioned respective embodiments. In the present embodiment also, the case that the peak value of the echo signal is used for determining the reference pulse will be exemplified.

FIG. 12 is for explaining the outline of the quasi-stationary state generation process to be executed by the quasi-stationary state generation unit related to the present embodiment. When the direction of the static magnetic field is set as the z-axis direction, nuclear magnetization 1201 of atomic nuclear spin in the thermal equilibrium state faces toward the z-axis direction. If the quasi-stationary state generating RF pulse is applied in the previously set β1-direction at α-degrees of flip angle, nuclear magnetization 1202 flips by α-degrees. In the present diagram, the case that β1 is set as "−y" direction is exemplified. After that, if the spoiler gradient magnetic field is applied in at least one direction of x, y and Z-directions, xy-component of nuclear magnetization 1203 of atomic nuclear spin is diffused in xy-plane via the dispersion process caused by the spoiler gradient magnetic field or the hyperfine magnetic field. In that condition, if the quasi-stationary state generating RF pulse is further applied in β2-direction at α-degrees of flip angle, since the respective nuclear magnetizations being diffused in the xy-plane flip by α-degrees, nuclear magnetization 1204 is diffused in the z-direction. In the present diagram, the case that β2 is set as the x-direction will be exemplified. The spoiler gradient magnetic field application time (GCInterval) is sufficiently shorter than the relaxation time. In the present embodiment, the transverse magnetization is saturated by applying the spoiler gradient magnetic field. In the following description, application direction upon the m-th application of the quasi-stationary state generating RF pulse will be denoted as βm.

By alternately repeating application of the RF pulse in βm-direction at α-degrees of flip angle and dispersion process caused by the hyperfine magnetic field, both the longitudinal magnetization and the transverse magnetization are saturated, and the state that the echo signal has the value lower than a predetermined threshold value, i.e. quasi-stationary state 1205 is generated. The direction to apply the quasi-stationary state generating RF pulse should be set in advance. For example, a plurality of application directions and application order in the respective directions are to be set in advance.

Next, procedure of the quasi-stationary state generation process to be executed by the quasi-stationary state generation unit related to the present invention will be described. FIG. 13 is a flowchart of the quasi-stationary state generation process to be executed by the quasi-stationary state generation unit of the present embodiment. Upon receiving the command to generate the quasi-stationary state, the quasi-stationary state generation unit first initializes counter "m" for counting application frequency of the quasi-stationary state generating RF pulse (here, m=1) (step S1301). Next, the quasi-stationary state is applied in βm-direction at α-degrees of flip angle along with the slice selecting gradient magnetic field (step S1302).

After passing of a predetermined time (WT) (step S1303), the quasi-stationary state generation unit measures the echo signal intensity (step S1304), and discriminates the magnitude relation between echo signal intensity EC and threshold value L (step S1305). Here, when the echo signal intensity the value greater than the predetermined threshold value, the spoiler gradient magnetic field is applied (step S1306), and counter "m" is incremented (step S1307). Then the process returns to step 1302, and quasi-stationary state generating RF pulse βmα is applied again in βm-direction at α-degrees of flip angle along with the slice gradient magnetic field.

On the other hand, in S1305, when the echo signal intensity has the value lower than the predetermined threshold value, after passing of the predetermined time (longitudinal magnetization recovery time TI) (step S1308), generation of the quasi-stationary state is notified to the reference RF pulse determination unit (step S1309). In the present embodiment also, in step S1303, the state that the echo signal intensity becomes 0 may be discriminated as the quasi-stationary state.

Next, the pulse sequence for actualizing the reference pulse determination process related to the present embodiment will be described. FIG. 14 is a sequence diagram for explaining the outline of the reference pulse determination process related to the present embodiment. As shown in the diagram, upon starting of the reference pulse determination process, sequence 1410 for actualizing the quasi-stationary state generation process is first executed. Here, the quasi-stationary state generation unit alternately repeats application of quasi-stationary state generating RF pulse 1401 in βm-direction (m=1, 2, 3, . . . ) at α-degrees of flip angle and application of spoiler gradient magnetic fields 1409, 1410 and 1411 in at least one direction of x, y and z-directions, until intensity of the echo signal is lower than the predetermined threshold value. Also, slice gradient magnetic field 1402 is applied at the same time that the respective quasi-stationary state generating RF pulses 1401 are applied.

From the time that the echo signal reaches the value lower than a predetermined threshold value, after passing of longitudinal magnetization recovery time TI 1405, the reference pulse determination unit executes a predetermined sequence 1420 such as the SE method or GE method for determining the reference pulse, and stores the executed sequence along with the reference pulse intensity.

By repeating the above-described sequence 1410 and sequence 1420 for a predetermined number of times and recording the pair of the reference determining RF pulse intensity and the peak value of the echo signal acquired by the relevant RF pulse, the optimum intensity is determined.

Processing procedure of the reference pulse determination process to be executed by the reference pulse determination unit of the present embodiment will be omitted here since it is the same as the first embodiment.

As stated above, in accordance with the present embodiment, the interval for repeating applications of the reference determining RF pulse for setting the reference RF pulse is the sum of the time for generating the quasi-stationary state and the longitudinal magnetization recovery time (TI). The time interval that the quasi-stationary state is generated is (GCInterval+WT)×(application frequency of the quasi-stationary state generating RF pulse "m"−1)+WT. (GCInterval+WT)×(m−1)+WT is much shorter compared to the time that the nuclear spin returns to the thermal equilibrium state. Particularly, unlike the first and second embodiments, after applying the quasi-stationary state generating RF pulse, the spoiler gradient magnetic field is applied in place of waiting for the interval time in the present embodiment. By doing so, it is possible to reduce the time for eliminating the transverse magnetization, and to generate the quasi-stationary state more effectively. Also, in the present embodiment, the quasi-stationary state generating RF pulses are applied by varying their direction each time. Since the magnetization can be diffused in a desired direction, the quasi-stationary state can be generated by a smaller number of application frequencies of the RF pulses compared to the first embodiment which repeats applications in the same direction. Therefore, it is possible to further reduce the time for repeating application of the reference determining RF pulse and for setting the reference RF pulse compared to the above-described respective embodiments, which leads to reduction of the entire measurement time. In the present embodiment also, since the intervals between applications of the quasi-stationary state generating RF pulse are shorter, the interval between the sounds caused by applying the RF pulse is shorter compared to the conventional methods.

Also, since application frequency of the quasi-stationary state generating RF pulse is reduced, electro-magnetic energy to be absorbed by the object (OAR) can also be reduced.

While the case that the flip angle of the quasi-stationary state generating RF pulse is set constant in the quasi-stationary state generation process is exemplified in the above-described respective embodiments, the flip angle can also be varied for each application. Also, while the case that the interval between applications of the quasi-stationary state generating RF pulse is constant is exemplified in the first and second embodiments, this can also be varied. In the case of applying the spoiler gradient magnetic field, the intensity thereof can also be varied.

FIG. 15 is a flowchart of the quasi-stationary generation process to be executed by the quasi-stationary generation unit in the case of varying the flip angle for each application. Here, the direction of the m-th time application of the quasi-stationary state generating RF pulse is set as βm, and the flip angle is set as αm-degrees. The quasi-stationary state generating RF pulse in βm-direction at αm-degrees of flip angle will be denoted as RFβmαm. Also, the intensity of the spoiler gradient magnetic field to be applied right after m-th time of quasi-stationary state generating RF pulse application is set as Gm. At this time, application direction, flip angle and the spoiler gradient magnetic field intensity are to be set in advance for each time.

Upon receiving the command to generate the quasi-stationary state, the quasi-stationary state generation unit first initializes counter "m" (here, m=1) for counting application frequency of the quasi-stationary state generating RF pulses (step S1501). Then quasi-stationary state generating RF pulse RFβmαm is applied in βm-direction at a m-degrees of flip angle, along with the slice selecting gradient magnetic field (step S1502).

After passing of the predetermined time (WT) (step S1503), the quasi-stationary state generation unit measures the echo signal intensity (step S1504), and discriminates magnitude relation between echo signal intensity EC and threshold value L (step S1505). Here, when the echo signal intensity has the value greater than the predetermined threshold value, the spoiler gradient magnetic field of intensity Gm is applied in the respective axis-directions (step S1506), and counter "m" is incremented by 1 (step S1507). Then the process returns to step S1502, and quasi-stationary state generating RF pulse RF βmαm is applied again in βm-direction at αm-degrees of flip angle along with the slice gradient magnetic field.

On the other hand, in step S1505, when the echo signal intensity has the value lower than the predetermined threshold value, after passing of a predetermined time (longitudinal magnetization recovery time TI) (step S1508), generation of the quasi-stationary state is notified to the reference RF pulse determination unit (step S1509). In step S1505, the state that the echo signal intensity becomes 0 may be discriminated as the quasi-stationary state.

FIG. 16 shows the sequence example for actualizing the reference pulse determination process. As shown in the diagram, when the reference pulse determination process is started, sequence 1610 for actualizing the quasi-stationary state generation process is executed. Here, application of quasi-stationary state generating RF pulse 1601 and slice selecting gradient magnetic field 1602 in β1-direction at α1-degrees of flip angle and application of spoiler gradient magnetic fields (1609, 1610 and 1611) in at least one direction of the x, y and z-directions are to be alternately repeated until the echo signal has the value lower than a predetermined threshold value.

After passing of longitudinal magnetization recovery time TI 1605 from the time that the echo signal reached the predetermined threshold value, the reference pulse determination unit executes a predetermined sequence 1620 such as the SE method or GE method for determining the reference pulse. After the execution of the sequence, the sequence is stored along with the reference RF pulse intensity.

While the case that, application direction of the quasi-stationary state generating RF pulse is also varied when the flip angle thereof is to be varied for each application is exemplified above, application direction of the quasi-stationary state generating RF pulse may be fixed. Since nuclear magnetization can be flipped and dispersed for the desired angle by varying the flip angle for each application, it is more likely to that the time for generating the quasi-stationary state can be reduced further.

In the above-described respective embodiments, flip angle, direction and interval for application of quasi-stationary state generating RF pulse and with or without of the spoiler gradient magnetic field are set in advance in the quasi-stationary state generation process. However, it may be set so that an operator can set or adjust them at the time of execution.

In this case, MRI apparatus 100 of the present embodiment comprises a GUI processor. GUI processor is for generating setting screen 1700 and making display 20 to display the screen. Also, it receives the inputted command via operation unit 25 and display 20.

FIG. 17 is an example of setting screen 1700 to be generated and displayed by the GUI processor. As shown in the diagram, setting screen 1700 comprises flip angle setting unit 1710 which receives the intensity (flip angle) of the quasi-stationary state generating RF pulse, direction setting unit 1720 which receives the application direction of the quasi-stationary state generating RF pulse, interval setting unit 1730 which receives the interval between applications of the quasi-stationary state generating RF pulse in the case that the spoiler gradient magnetic field is not to be applied, and spoiler gradient magnetic field intensity setting unit 1740 which receives the intensity of the spoiler gradient magnetic field in the case that the spoiler gradient magnetic field is to be applied. Interval setting unit 1730 and spoiler gradient magnetic field intensity setting unit 1740 are to beset so that only one of them can be inputted at a time.

Each unit may be settable for each application of the quasi-stationary state generating RF pulse. In this case, a predetermined number of edit boxes should be provided for each of flip angle setting unit 1710, direction setting unit 1720, interval setting unit 1730 and spoiler gradient magnetic field intensity setting unit 1740. Also, setting item selecting unit 1790 may be comprised so that the operator can select and change the setting items for each RF pulse application. To the setting items selecting unit, check buttons (1791, 1792, 1793 and 1794) for receiving the command to change the intensity, application direction, application intervals of the quasi-stationary state generating RF pulse and the intensity of the spoiler gradient magnetic field should be provided for each application respectively. In this case, the setting may be that only the parameters related to the items selected by the operator can be inputted.

Setting screen 1700 further comprises confirmation button 1750 which receives the command inputted by the operator and start button 1760 which receives the command to start the reference pulse determination process. It may further comprise sequence display window 1770 which indicates the outline of the sequence to be actualized by the inputted parameters when confirm button 1750 is pushed down by the operator and scan result display window 1780 which displays the echo signal intensity with respect to the scanned reference determining RF pulse intensity.

GUI processor notifies the parameters received via setting screen 1700 to the reference pulse determination unit and the quasi-stationary state generation unit. The reference pulse determination unit and the quasi-stationary state generation unit execute the process in accordance with the received parameters.

In the case that the parameter is varied for each application of the quasi-stationary state generating RF pulse, the quasi-stationary state generation unit executes the process using the parameters in order of the numbers appended to the edit box. In the case that the quasi-stationary state cannot be generated even when all the numbers are inputted, the process returns again to the process of the column having the minimum number to continue the execution.

Also, setting screen 1700 may comprise application frequency receiving unit 1810 which receives application frequency of the quasi-stationary state generating RF pulse. In this case, generation of the quasi-stationary state is discriminated at the point when the quasi-stationary state generating RF pulse is applied for the number of times that are received by application frequency receiving unit 1790. Therefore, in the quasi-stationary state generation process of the above-described respective embodiments, the process to measure the echo signal intensity and to discriminate magnitude relation between the measured intensity and the threshold value will be not executed. In the case that application frequency of the quasi-stationary state generating RF pulse necessary for generating the quasi-stationary state can be estimated from empirical data, since the discrimination process can be omitted by assigning the application frequency, the time for the entire measurement process can be reduced.

While the case that the reference determining RF pulse to be used for the sequence of the reference pulse determination process is set as 90-degrees is exemplified, flip angle of the reference determining RF pulse is not limited thereto. The reference pulse of the RF pulse can be determined at desired degrees of flip angle.

DESCRIPTION OF THE REFERENCE NUMERALS

Figure 1:
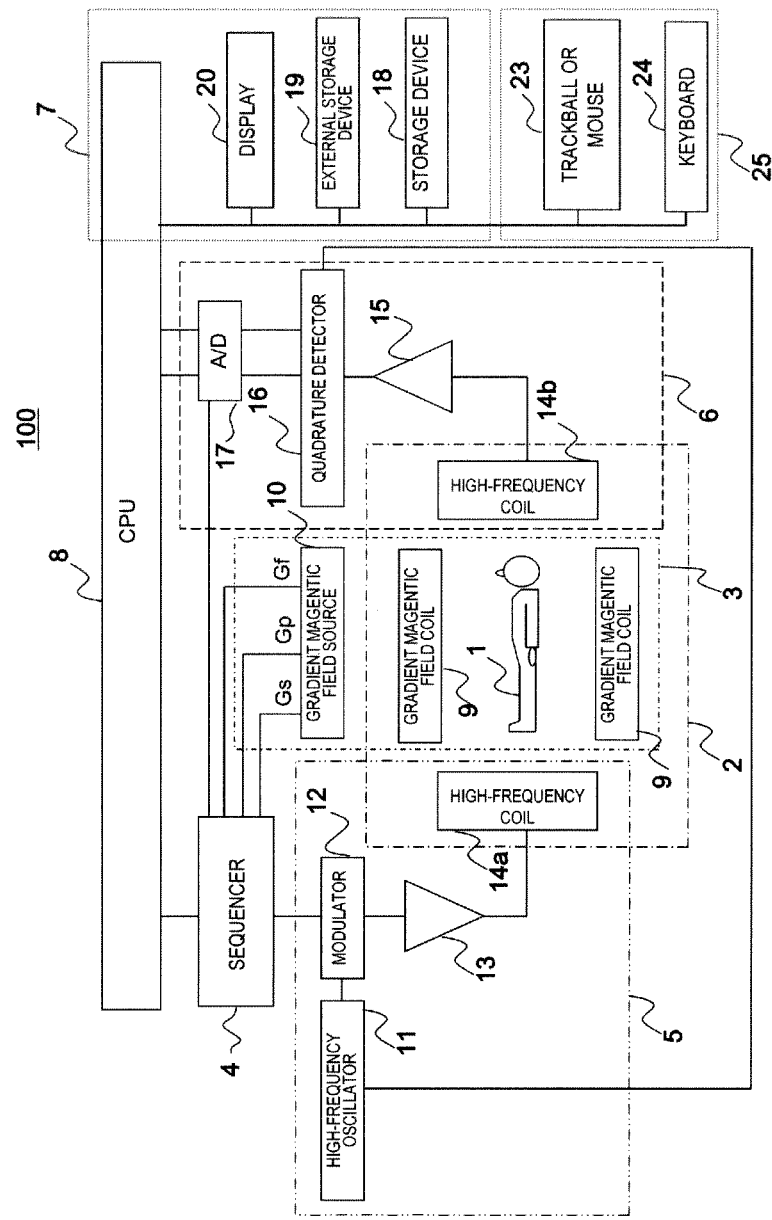
FIG. 1 is a block diagram showing the general configuration of the MRI apparatus of the first embodiment.
Figure 2:
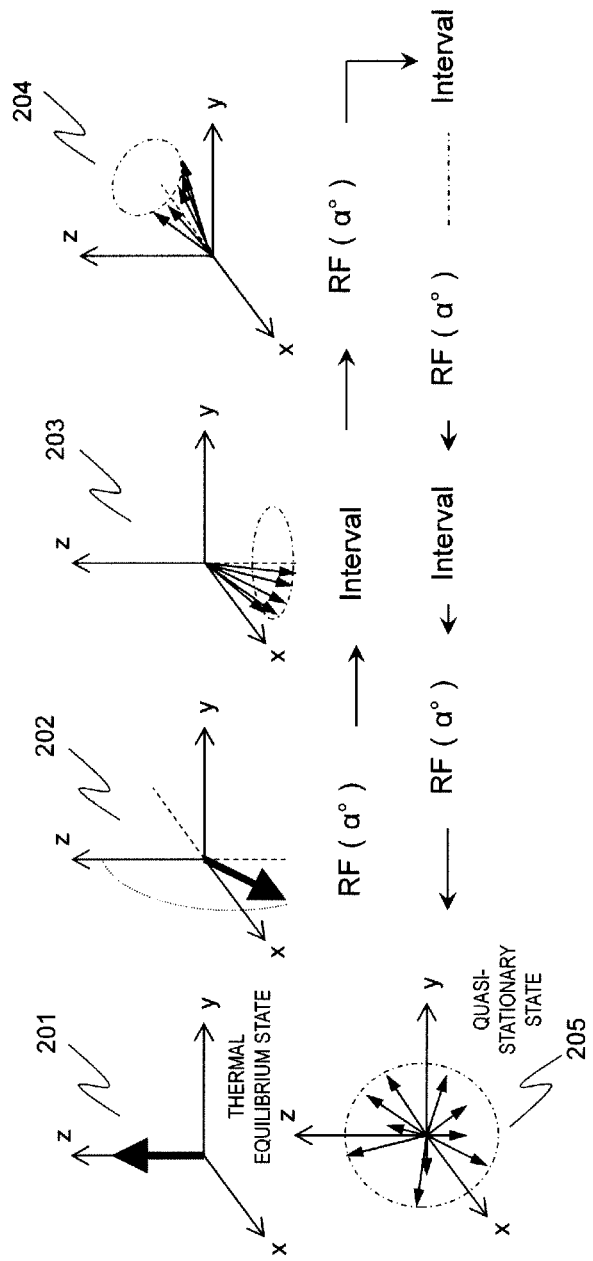
FIG. 2 is for explaining the outline of the quasi-stationary state generation process of the first embodiment.
Figure 3:
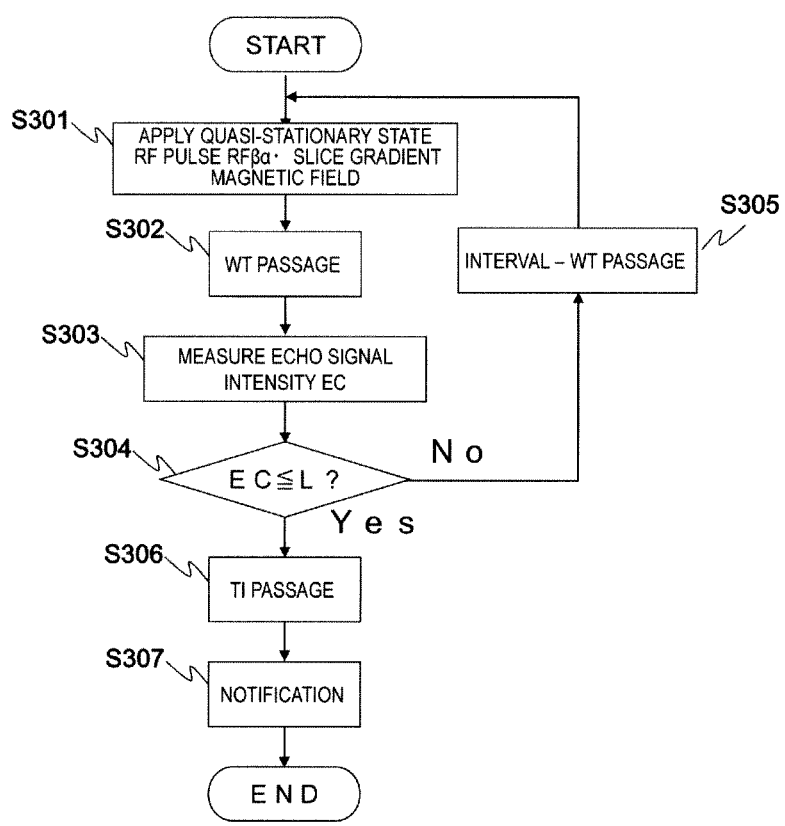
FIG. 3 is a flowchart of the quasi-stationary state generation process in the first embodiment.
Figure 4:
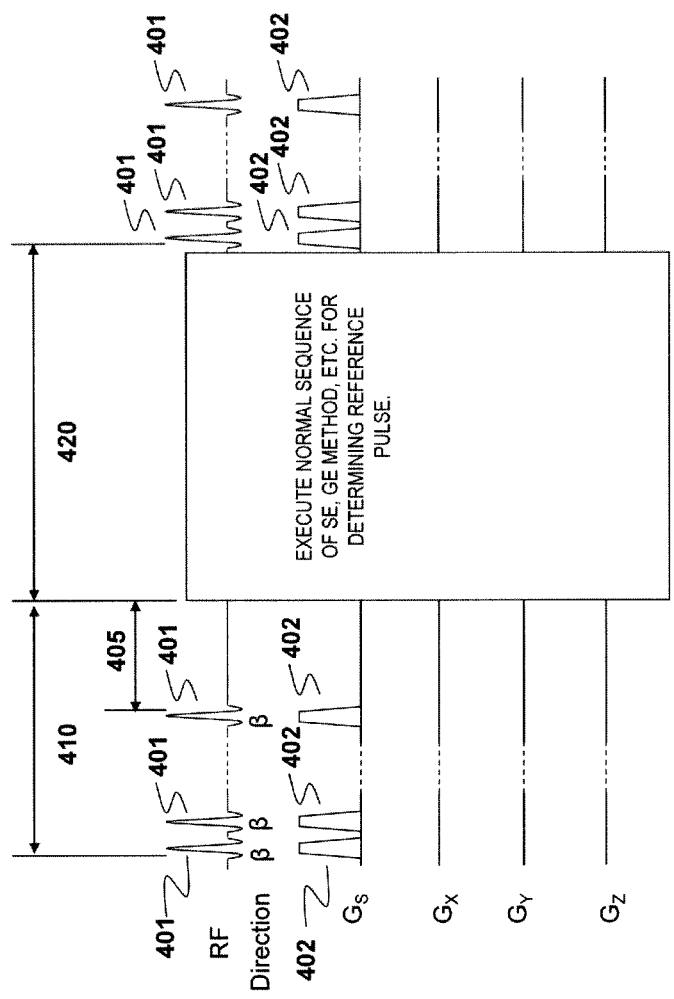
FIG. 4 is a pulse sequence diagram for explaining the outline of the reference pulse determination process related to the first embodiment.
Figure 5:
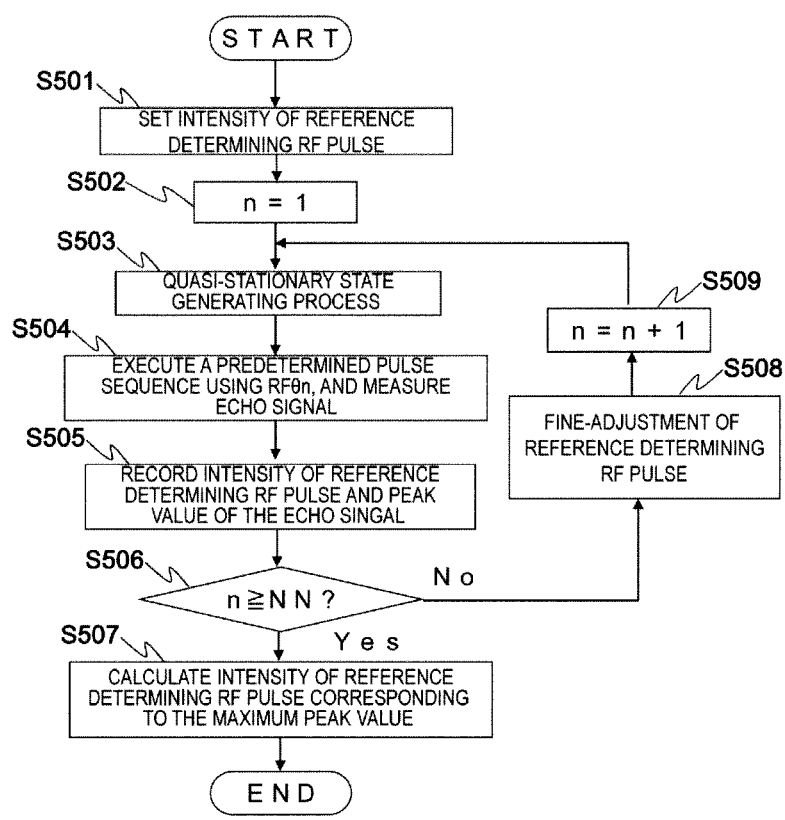
FIG. 5 is a flowchart of the reference pulse determination process in the first embodiment.
Figure 6:
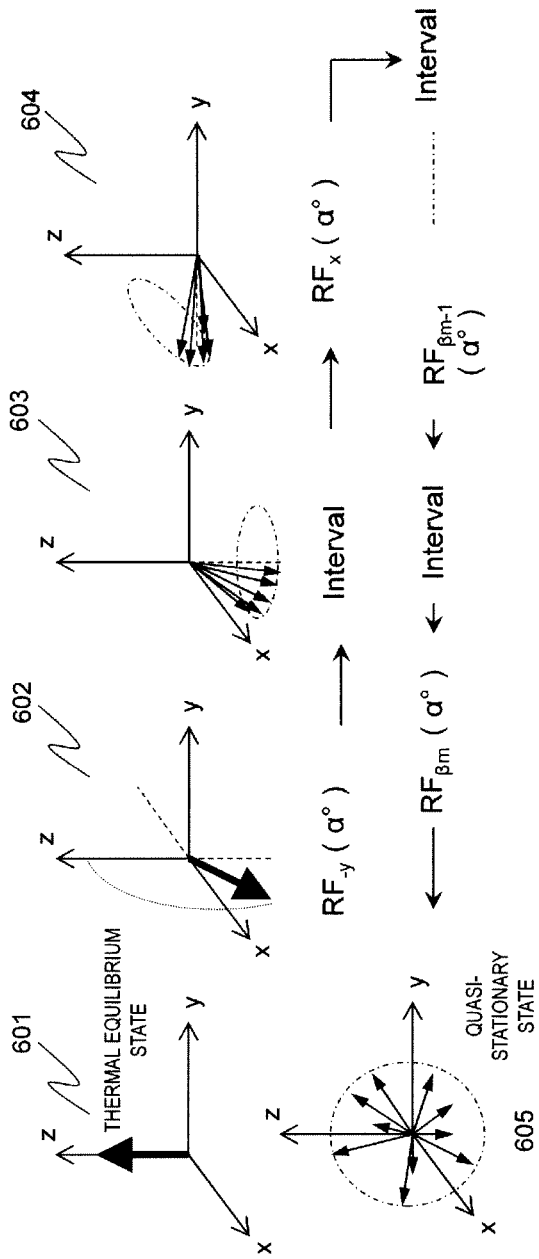
FIG. 6 is for explaining the outline of the quasi-stationary state generation process in the second embodiment.
Figure 7:
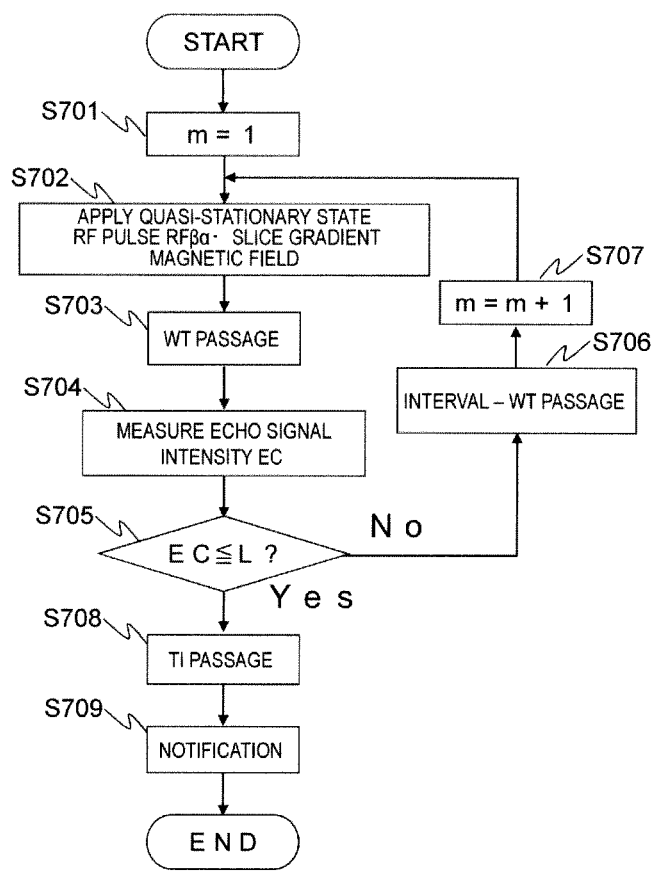
FIG. 7 is a flowchart of the quasi-stationary state generation process in the second embodiment.
Figure 8:
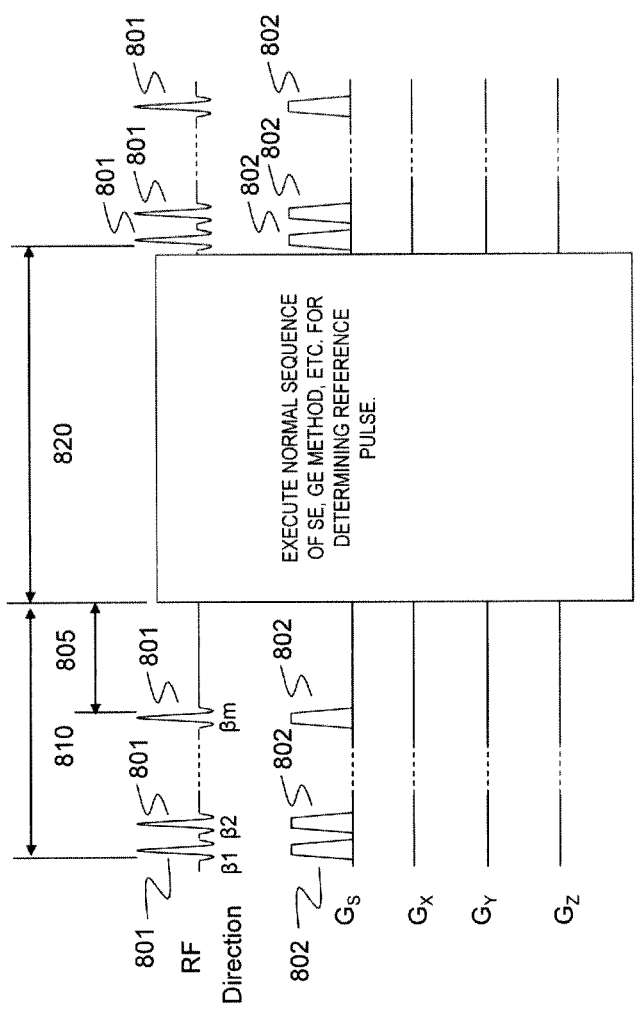
FIG. 8 is a pulse sequence diagram for explaining the outline of the reference pulse determination process related to the second embodiment.
Figure 9:
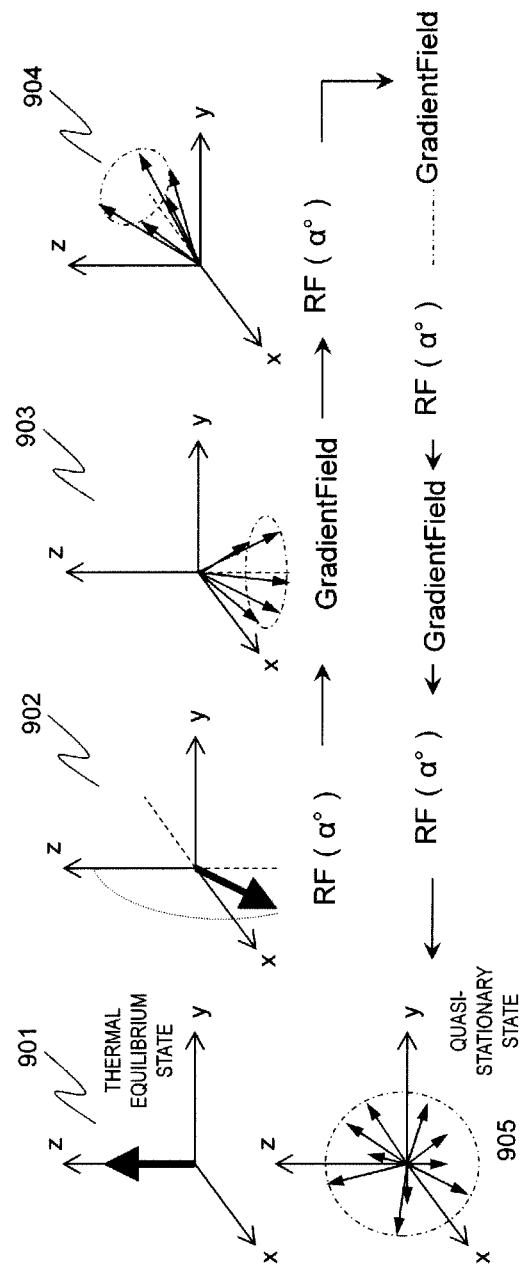
FIG. 9 is for explaining the outline of the quasi-stationary state generation process in the third embodiment.
Figure 10:
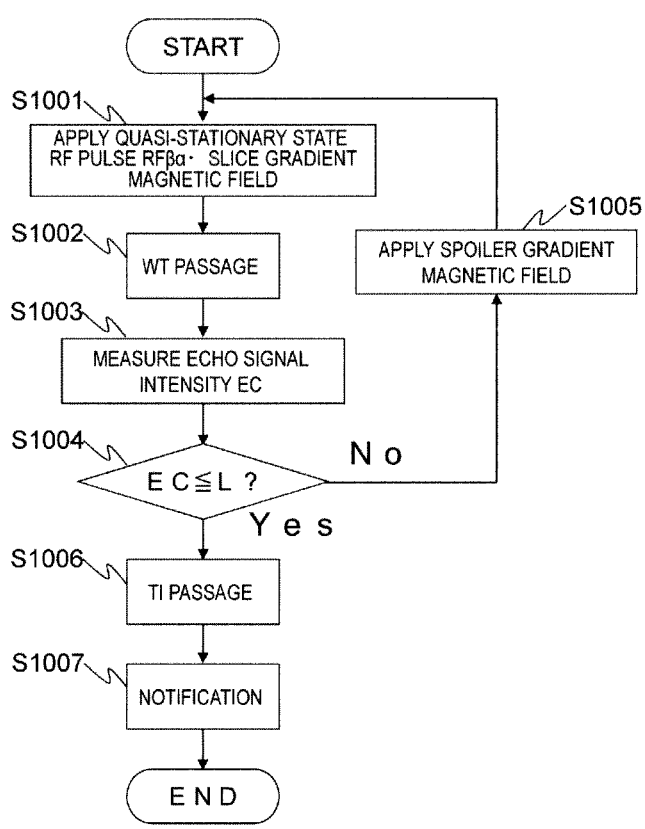
FIG. 10 is a flowchart of the quasi-stationary state generation process in the third embodiment.
Figure 11:
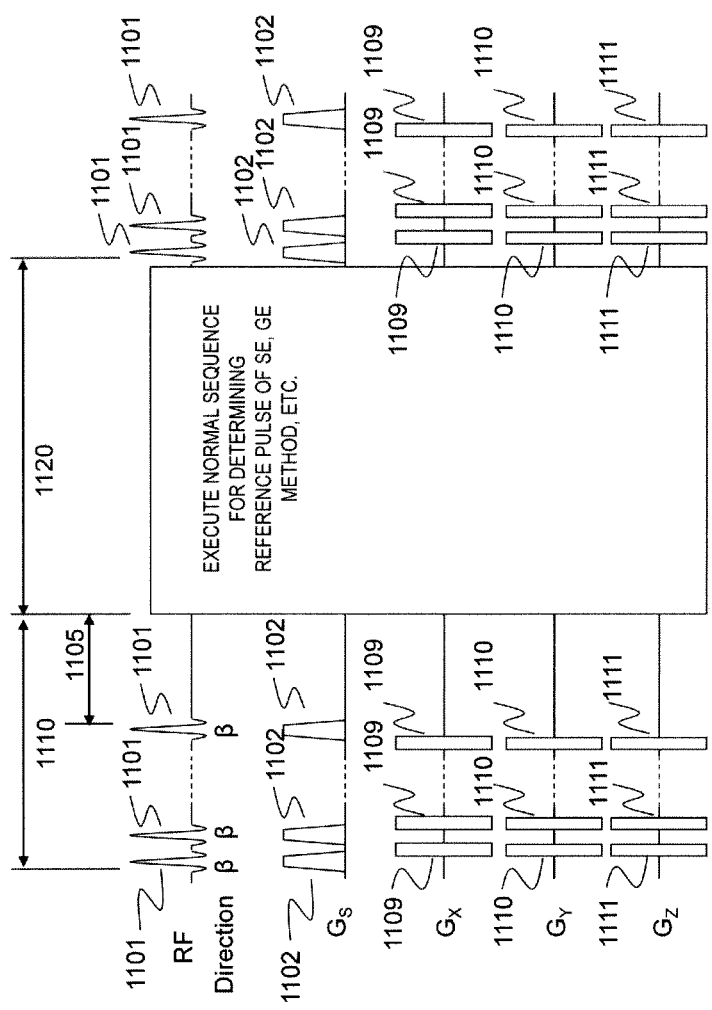
FIG. 11 is a pulse sequence diagram for explaining the outline of the reference pulse determination process in the third embodiment.
Figure 12:
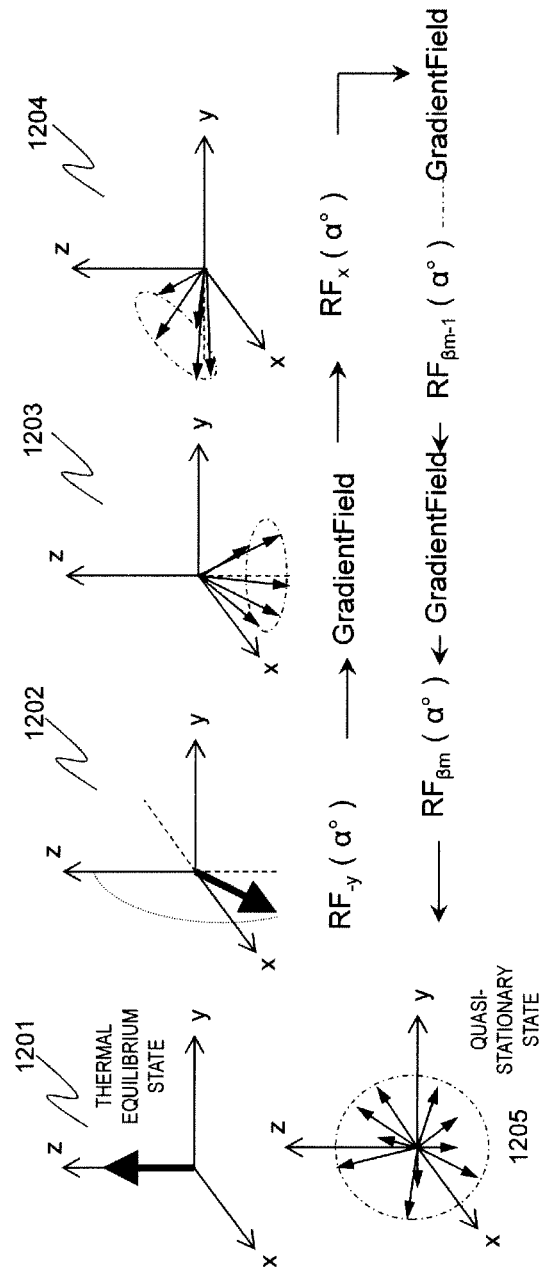
FIG. 12 is for explaining the outline of the quasi stationary state generation process in the fourth embodiment.
Figure 13:
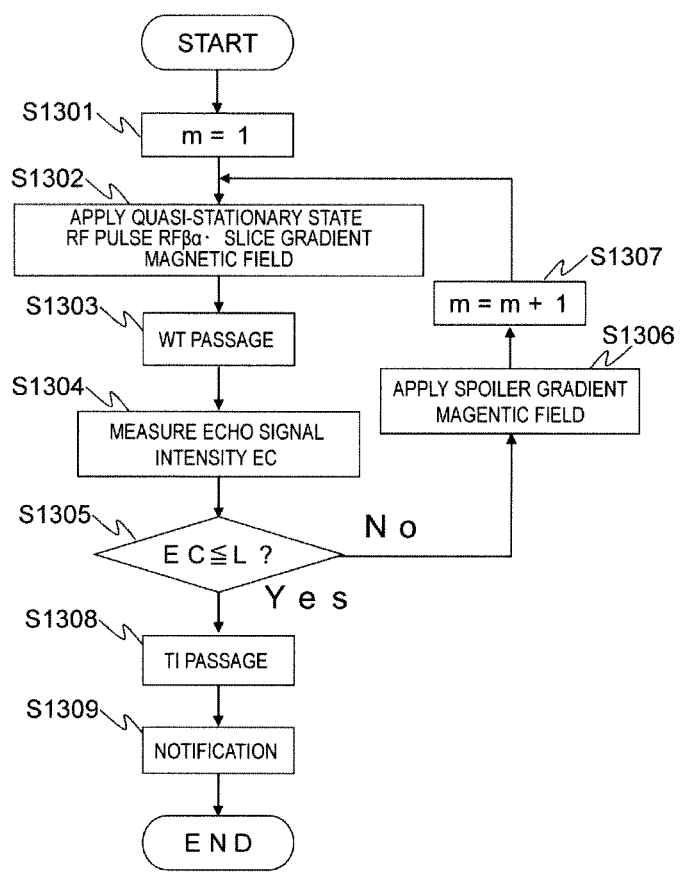
FIG. 13 is a flowchart of the quasi-stationary state generation process in the fourth embodiment.
Figure 14:
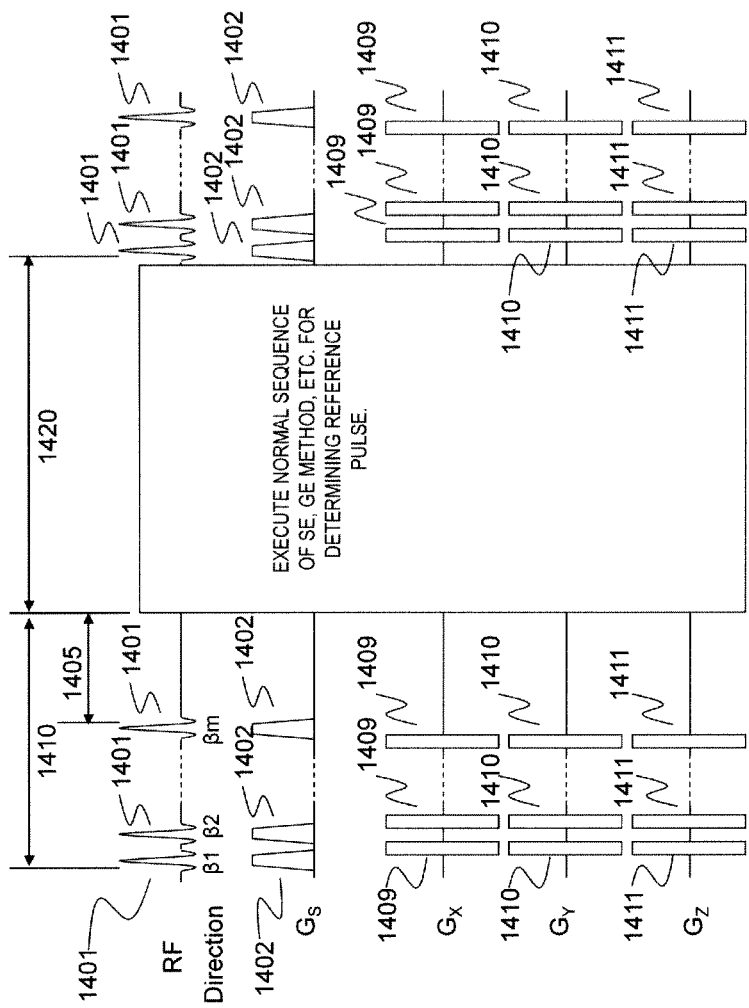
FIG. 14 is a pulse sequence diagram for explaining the outline of the reference pulse determination process in the fourth embodiment.
Figure 15:
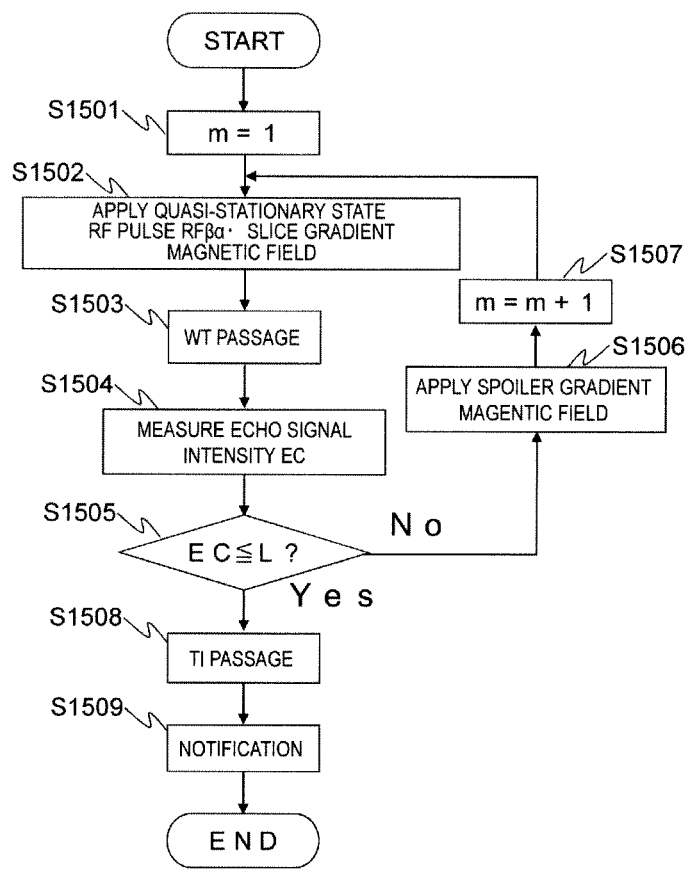
FIG. 15 is another example of the flowchart of the quasi-stationary state generation process related to the embodiment in the present invention.
Figure 16:
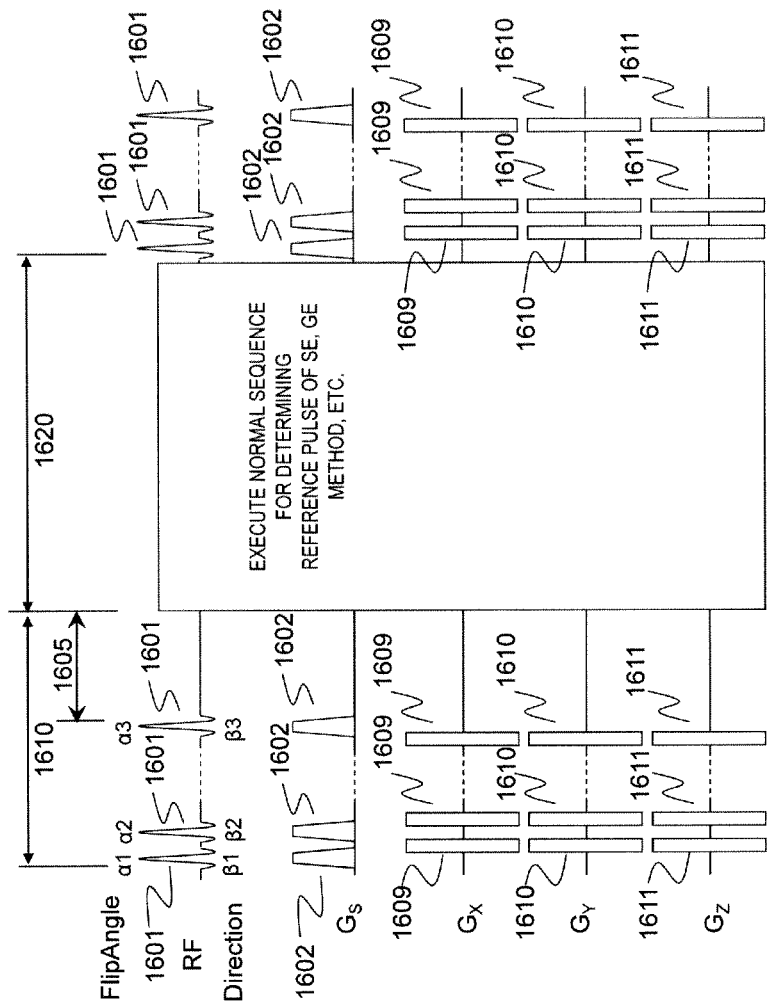
FIG. 16 is another example of the pulse sequence diagram for explaining the outline of the reference pulse determination process related to the embodiment in the present invention.
Figure 17:
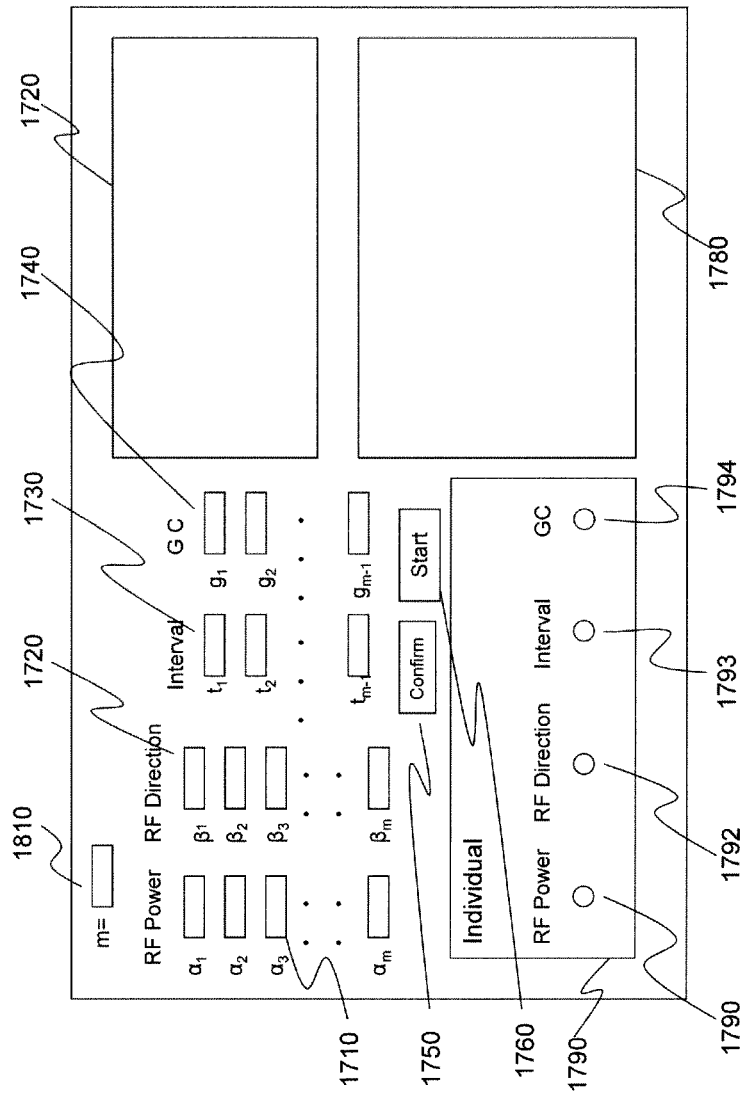
FIG. 17 is an example of a setting screen related to the embodiment in the present invention.

1: object, 2: static magnetic field generation system, 3: gradient magnetic field generation system, 4: sequencer, 5: transmission system, 6: reception system, 7: signal processing system, 8: central processing unit (CPU), 9: gradient magnetic field coil, 10: gradient magnetic field source, 11: high-frequency oscillator, 12: modulator, high-frequency amplifier, 14a: high-frequency coil (transmission coil), 14b: high-frequency coil (reception coil), 15: signal amplifier, 16: quadrature detector, 17: A/D converter, 18: storage device, 19: external storage device, 20: display, 23: trackball or mouse, 24: keyboard, 25: operation unit, 100: MRI apparatus

The invention claimed is:

1. A magnetic resonance imaging apparatus comprising:
a gradient magnetic field application unit configured to apply a gradient magnetic field to an object to be examined placed in a static magnetic field;
a radio-frequency magnetic field pulse application unit configured to apply a radio-frequency magnetic field pulse that excites magnetization of the object at a predetermined flip angle;
a measurement unit configured to measure the magnetic resonance signals produced from the object;
a control unit configured to control operation of the gradient magnetic field application unit, radio-frequency magnetic field pulse application unit and measurement unit,
wherein the control unit further comprises a quasi-stationary state generation unit configured to control operation of the gradient magnetic field application unit and radio-frequency magnetic field pulse application unit, so as to generate the quasi-stationary state having the magnetic resonance signal which has the value lower than a predetermined threshold value within a predetermined time period after the radio-frequency magnetic field pulse application unit applies the radio-frequency magnetic field pulse.

2. The magnetic resonance imaging apparatus according to claim 1, wherein the quasi-stationary state generation unit comprises:
- a quasi-stationary state radio-frequency magnetic field pulse application unit configured to apply the radio-frequency magnetic field pulse for generating the quasi-stationary state;
- a discrimination unit configured to discriminate whether intensity of the magnetic resonance signal has the lower value than the threshold value or not after the predetermined time; and
- a quasi-stationary state generation control unit configured to control the operation of the quasi-stationary state high-frequency magnetic pulse application unit in accordance with the discrimination result of the discrimination unit.

3. The magnetic resonance imaging apparatus according to claim 2, wherein the quasi-stationary generation control unit, when the discrimination result by the discrimination unit is negative, causes the quasi-stationary state high-frequency field pulse application unit to apply the radio-frequency magnetic field pulse again.

4. The magnetic resonance imaging apparatus according to claim 3, characterized in that application direction of the radio-frequency magnetic field pulse is constant.

5. The magnetic resonance imaging apparatus according to claim 3, characterized in that flip angle of the radio-frequency magnetic field pulse is constant.

6. The magnetic resonance imaging apparatus according to claim 2, wherein the quasi-stationary state generation unit, when discrimination result by the discrimination unit is negative, causes the quasi-stationary state radio-frequency magnetic field pulse application unit to apply the radio-frequency magnetic field pulse again after applying a spoiler gradient magnetic field pulse.

7. The magnetic resonance imaging apparatus according to claim 6, characterized in that application direction of the radio-frequency magnetic field pulse is constant.

8. The magnetic resonance imaging apparatus according to claim 6, characterized in that flip angle of the radio-frequency magnetic field pulse is constant.

9. The magnetic resonance imaging apparatus according to claim 6, characterized in that intensity of the spoiler gradient magnetic field pulse is constant.

10. The magnetic resonance imaging apparatus according to claim 1, characterized in further comprising an operation unit that receives input of parameters from an operator, wherein the operation unit comprises a display screen, and the quasi-stationary state generation unit receives input of parameters for generating the quasi-stationary state from the operator via the display screen.

11. The magnetic resonance imaging apparatus according to claim 1, wherein:
- the control unit further comprises an optimum intensity determination unit configured to determine the optimum intensity suited for an examination target with respect to the aimed flip angle upon application of the radio-frequency magnetic field pulse in measurement; and
- the optimum intensity determination unit applies the radio-frequency magnetic field pulse while varying the intensity after waiting for the quasi-stationary state generation unit to generate the quasi-stationary state, repeats measurement of the magnetic resonance signal, and determines the intensity when the magnetic resonance signal has the maximum value as the optimum intensity.

12. An initial state creation method in a magnetic resonance imaging apparatus comprising:
- a gradient magnetic field application unit configured to apply a gradient magnetic field to an object to be examined in a static magnetic field;
- a radio-frequency magnetic field pulse application unit configured to apply a radio-frequency magnetic field pulse for exciting magnetization of the object at a predetermined flip angle;
- a measurement unit configured to measure a magnetic resonance signal produced from the object; and
- a control unit configured to control operation of the gradient magnetic field application unit, radio-frequency magnetic field pulse application unit and measurement unit,
- characterized in repeating application of the radio-frequency magnetic field pulse until intensity of the magnetic resonance signal to be measured after a predetermined time from the relevant application has the value lower than a threshold value.

13. An optimum intensity determination method for determining the optimum intensity of a radio-frequency magnetic field pulse at the predetermined flip angle in a magnetic resonance imaging apparatus comprising:
- a gradient magnetic field application unit configured to apply a gradient magnetic field to an object to be examined in a static magnetic field;
- a radio-frequency magnetic field pulse application unit configured to apply a radio-frequency magnetic field pulse for exciting magnetization of the object at a predetermined flip angle;
- a measurement unit configured to measure a magnetic resonance signal produced from the object; and
- a control unit configured to control operation of the gradient magnetic field application unit, radio-frequency magnetic field pulse application unit and measurement unit,
- characterized in further comprising:
- a measurement step that applies a radio-frequency magnetic field pulse while varying the intensity after waiting for the initial state to be created by the initial state creation method described in claim 12, measures the magnetic resonance signal, and repeats storing the measured signal by corresponding it to the intensity of the applied radio-frequency magnetic field pulse; and
- an optimum intensity determination step that determines the intensity which corresponds to the maximum magnetic resonance signal in the measurement step as the optimum intensity.

14. A magnetic resonance imaging method in the magnetic resonance imaging apparatus comprising:
- a gradient magnetic field application unit configured to apply a gradient magnetic field to an object to be examined in a static magnetic field;
- a radio-frequency magnetic field pulse application unit configured to apply a radio-frequency magnetic field pulse for exciting magnetization of the object at a predetermined flip angle;
- a measurement unit configured to measure a magnetic resonance signal produced from the object; and
- a control unit configured to control operation of the gradient magnetic field application unit, radio-frequency magnetic field pulse application unit and measurement unit,
- characterized in further comprising:
- an optimum intensity determination step that determines the optimum intensity of the radio-frequency magnetic field pulse to be applied in measurement, in the optimum intensity determination method described in claim 13;

a measurement step that executes measurement using the radio-frequency magnetic field pulse having the determined optimum intensity; and an image reconstruction step that reconstructs an image from the measurement result in the measurement step.

* * * * *